(12) United States Patent
Tsai et al.

(10) Patent No.: US 11,004,805 B2
(45) Date of Patent: May 11, 2021

(54) SEMICONDUCTOR DEVICE AND METHOD OF FABRICATING SAME INCLUDING TWO SEAL RINGS

(71) Applicant: Winbond Electronics Corp., Taichung (TW)

(72) Inventors: Yao-Ting Tsai, Taichung (TW); Chiang-Hung Chen, Taichung (TW); Che-Fu Chuang, Taichung (TW); Wen Hung, Taichung (TW)

(73) Assignee: Winbond Electronics Corp., Taichung (TW)

( * ) Notice: Subject to any disclaimer, the term of this patent is extended or adjusted under 35 U.S.C. 154(b) by 42 days.

(21) Appl. No.: 16/542,305

(22) Filed: Aug. 16, 2019

(65) Prior Publication Data

US 2021/0050307 A1 Feb. 18, 2021

(51) Int. Cl.
*H01L 23/00* (2006.01)
*H01L 21/74* (2006.01)

(52) U.S. Cl.
CPC ............ *H01L 23/562* (2013.01); *H01L 21/74* (2013.01)

(58) Field of Classification Search
CPC .............................. H01L 23/562; H01L 21/74
See application file for complete search history.

(56) References Cited

U.S. PATENT DOCUMENTS

| | | | |
|---|---|---|---|
| 6,300,223 B1 * | 10/2001 | Chang | H01L 21/78 257/E21.599 |
| 6,841,455 B2 * | 1/2005 | West | H01L 23/562 257/508 |
| 7,893,459 B2 * | 2/2011 | Wang | H01L 23/585 257/170 |
| 8,125,052 B2 * | 2/2012 | Jeng | H01L 23/585 257/620 |
| 8,334,582 B2 * | 12/2012 | Jeng | H01L 23/562 257/620 |
| 8,643,147 B2 * | 2/2014 | Jeng | H01L 23/585 257/620 |

(Continued)

FOREIGN PATENT DOCUMENTS

| | | |
|---|---|---|
| CN | 208706621 | 4/2019 |
| TW | 200516671 | 5/2005 |

(Continued)

OTHER PUBLICATIONS

"Office Action of Taiwan Counterpart Application", dated Feb. 4, 2020, p. 1-p. 9.

*Primary Examiner* — John P. Dulka
(74) *Attorney, Agent, or Firm* — JCIPRNET

(57) ABSTRACT

Provided is a method of fabricating a semiconductor device, including the following steps. A first seal ring and a second seal ring that are separated from each other are formed on a substrate. A protective layer covering the first seal ring and the second seal ring is formed on the substrate. The protective layer between the first seal ring and the second seal ring includes a concave surface. The protective layer at the concave surface and a portion of the protective layer on the first seal ring are removed to form a spacer on a sidewall of the first seal ring, and form an opening in the protective layer. The width of the opening is greater than the width of the first seal ring, and the opening exposes a top surface of the first seal ring and the spacer.

20 Claims, 8 Drawing Sheets

(56) References Cited

U.S. PATENT DOCUMENTS

| | | | |
|---|---|---|---|
| 9,824,981 B2 * | 11/2017 | Yamada | H01L 23/5283 |
| 2004/0021227 A1 * | 2/2004 | Watanabe | H01L 23/562 |
| | | | 257/773 |
| 2006/0022195 A1 | 2/2006 | Wang | |
| 2008/0191309 A1 | 8/2008 | DeVries et al. | |
| 2009/0321890 A1 * | 12/2009 | Jeng | H01L 23/562 |
| | | | 257/620 |
| 2018/0012770 A1 * | 1/2018 | Macelwee | H01L 21/02507 |
| 2018/0261530 A1 * | 9/2018 | Sekikawa | H01L 21/76224 |
| 2018/0315723 A1 * | 11/2018 | Singh | H01L 23/522 |

FOREIGN PATENT DOCUMENTS

| | | |
|---|---|---|
| TW | 201442165 | 11/2014 |
| TW | 201740513 | 11/2017 |
| TW | 201842558 | 12/2018 |

\* cited by examiner

SEMICONDUCTOR DEVICE AND METHOD OF FABRICATING SAME INCLUDING TWO SEAL RINGS

BACKGROUND OF THE INVENTION

1. Field of the Invention

The present invention generally relates to an integrated circuit and a method of fabricating the same, and in particular, to a semiconductor device and a method of fabricating the same.

2. Description of Related Art

With the advancement of technologies, various types of electronic products are developed towards a trend of a high speed, high performance, and a light and short body. How to effectively utilize a chip area to improve a yield is a very important issue at present.

Cracks may occur in a wafer during dicing due to stress of a saw blade. Therefore, a seal ring is usually formed around a chip to avoid a yield loss caused by cracks extending into a chip region and damaging an internal circuit. However, a region of seal rings or a region between a seal ring and a chip region may occupy an excessive chip area.

SUMMARY OF THE INVENTION

Embodiments of the present invention provide a method of fabricating a semiconductor device, to avoid cracks occurring in a wafer during dicing due to stress of a saw blade, prevent an etching process from damaging lower layers with a layout change, and reduce a chip area occupied by seal rings.

An embodiment of the present invention provides a method of fabricating a semiconductor device, including the following steps. A first seal ring and a second seal ring that are separated from each other are formed on a substrate. A protective layer covering the first seal ring and the second seal ring is formed on the substrate. The protective layer between the first seal ring and the second seal ring includes a concave surface. The protective layer at the concave surface and a portion of the protective layer on the first seal ring are removed to form a spacer on a sidewall of the first seal ring, and form an opening in the protective layer. The width of the opening is greater than the width of the first seal ring, and the opening exposes a top surface of the first seal ring and the spacer.

An embodiment of the present invention provides a semiconductor device, including a first seal ring, a second seal ring, a spacer and a protective layer. The first seal ring and the second seal ring are separated from each other on the substrate. The spacer is arranged on a first sidewall of the first seal ring. The protective layer is arranged on the substrate and covers a second sidewall of the first seal ring and the second seal ring. The protective layer includes an opening exposing a top surface of the first seal ring and the spacer.

Based on the above, the first seal ring has a small width, and a spacing between the first seal ring and the second seal ring is small, thereby reducing a chip area occupied by seal rings. The opening (that is, an opening of a top via (TV)) has a large width, which helps improve the step coverage of a film formed subsequently in the opening.

To make the foregoing features and advantages of the present invention more comprehensible, embodiments accompanied with figures are described in detail below.

DESCRIPTION OF THE EMBODIMENTS

Figure 1A:
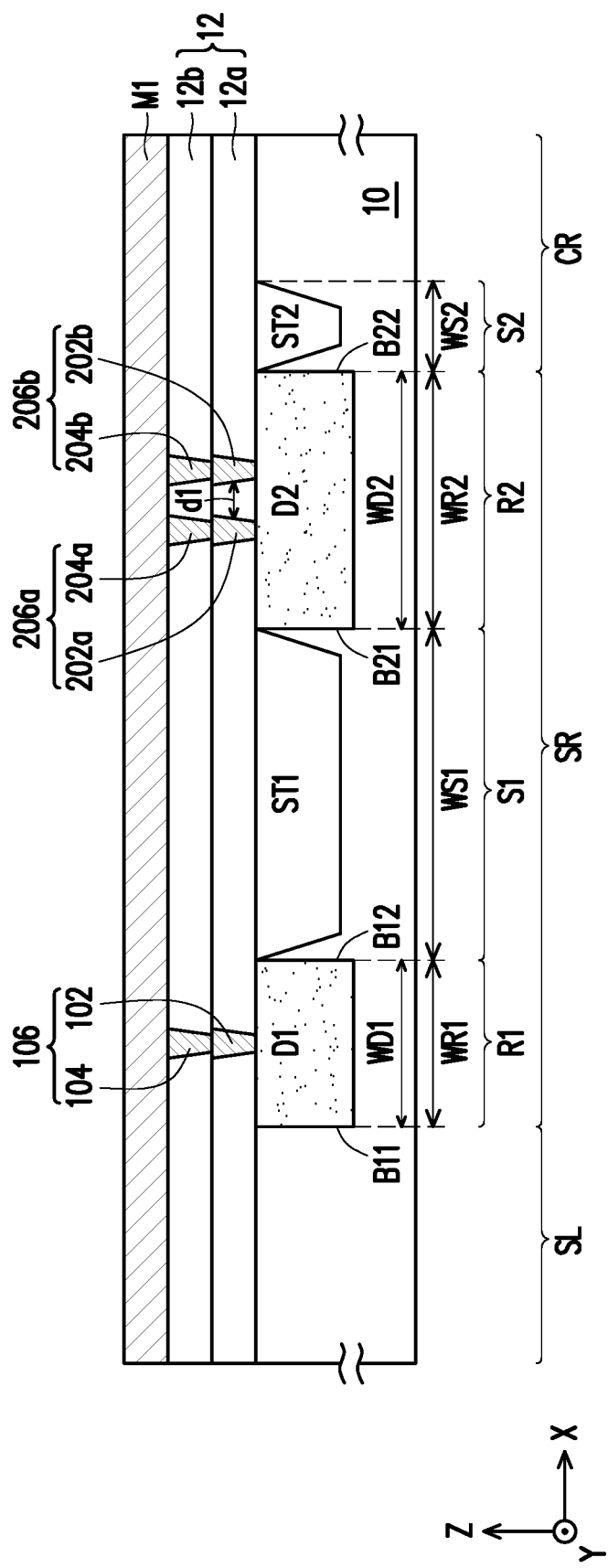
FIG. 1A to FIG. 1F are schematic sectional views of a fabricating process of a semiconductor device according to an embodiment of the present invention.

Referring to FIG. 1A, a substrate 10 is provided. The substrate 10 may be a semiconductor substrate 10. The substrate 10 may include a chip region CR, a seal ring region SR and a scribe line SL. The chip region CR may be used to form an electric device. The scribe line SL surrounds the chip region CR. Dicing may be performed along the scribe line SL in subsequent singulation steps. The seal ring region SR is located between the chip region CR and the scribe line SL. A seal ring may be formed in the seal ring region SR, which may prevent cracks caused by dicing a wafer from extending into the chip region CR and damaging the electric device in the chip region CR in subsequent singulation steps.

A plurality of isolation structures ST1 and ST2 is formed in the chip region CR and the seal ring region SR. For example, the isolation structure is a shallow trench isolation structure.

The width WS1 of a first isolation structure ST1 is greater than the width WS2 of a second isolation structure ST2. The first isolation structure ST1 in the seal ring region SR divides the seal ring region SR into a first region R1 and a second region R2. The first region R1 is closer to the scribe line SL than the second region R2, and the second region R2 is closer to the chip region CR than the first region R1. The second region R2 is located between the first isolation structure ST1 and the second isolation structure ST2. In some embodiments, the width WR1 of the first region R1 is less than the width WR2 of the second region R2, and the width WR2 of the second region R2 is less than the width WS1 of the first isolation structure ST1. For example, the width WR1 of the first region R1 is ½ to ⅔ of the width WR2 of the second region R2, and the width WS1 of the first isolation structure ST1 is 1.5 to 2.5 times the width WR2 of the second region R2. For example, the width of the seal ring region SR is 4.5 μm, the width WS1 of the first isolation structure ST1 is 2 μm, the width WR1 of the first region R1 is 1 μm, and the width WR2 of the second region R2 is 1.5 μm.

Referring to FIG. 1A, a first doped region D1 is formed in the first region R1, and a second doped region D2 is formed in the second region R2. The first doped region D1 and the second doped region D2 may have a same conductive type and a same doping concentration. The first doped region D1 and the second doped region D2 may have the same conductive type as the substrate 10; however, the doping concentrations of the first doped region D1 and the second doped region D2 are greater than a doping concentration of the substrate 10. The first doped region D1 and the second doped region D2 may be formed by a same ion implantation process.

Figure 1B:
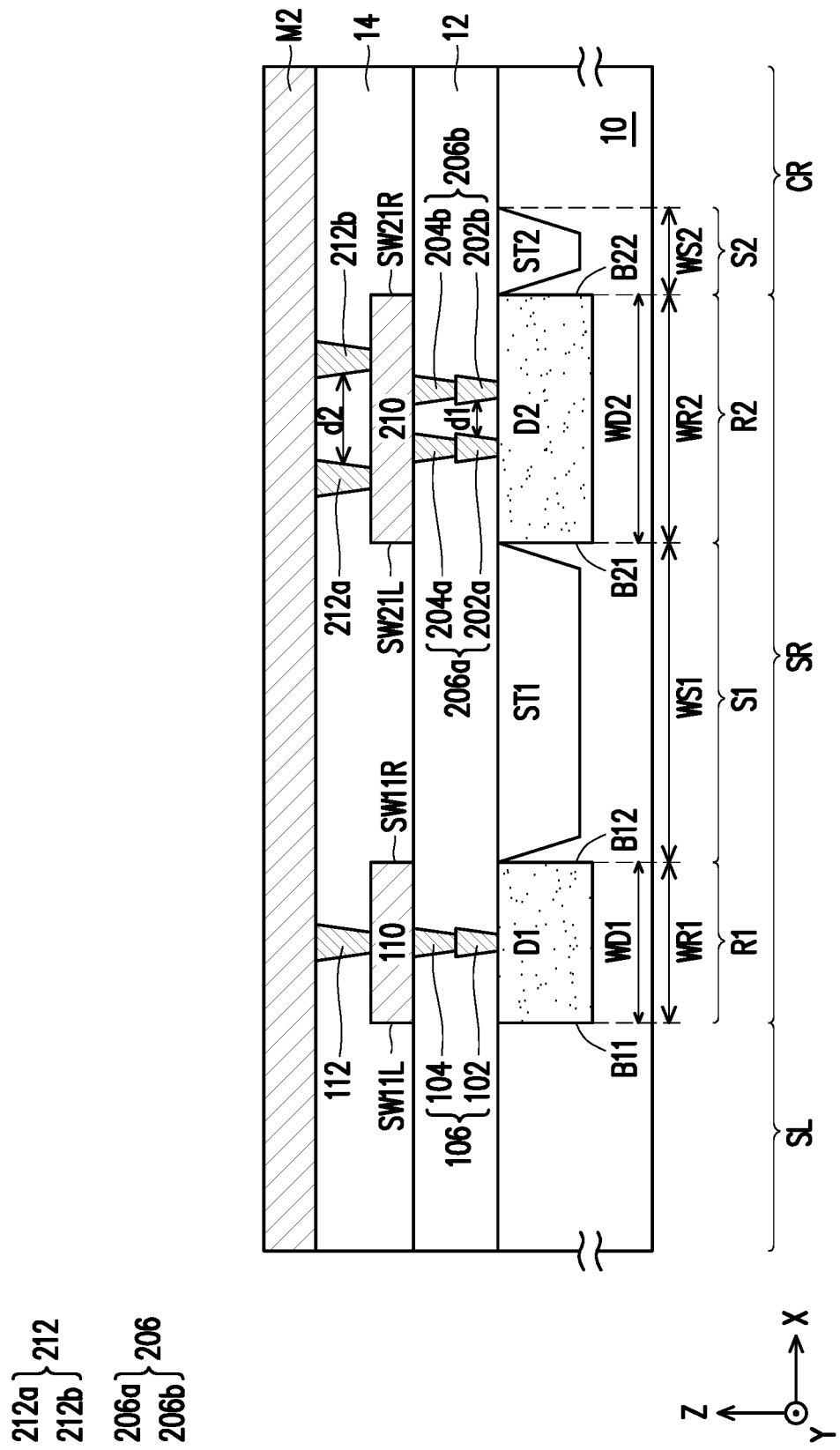
Figure 1C:
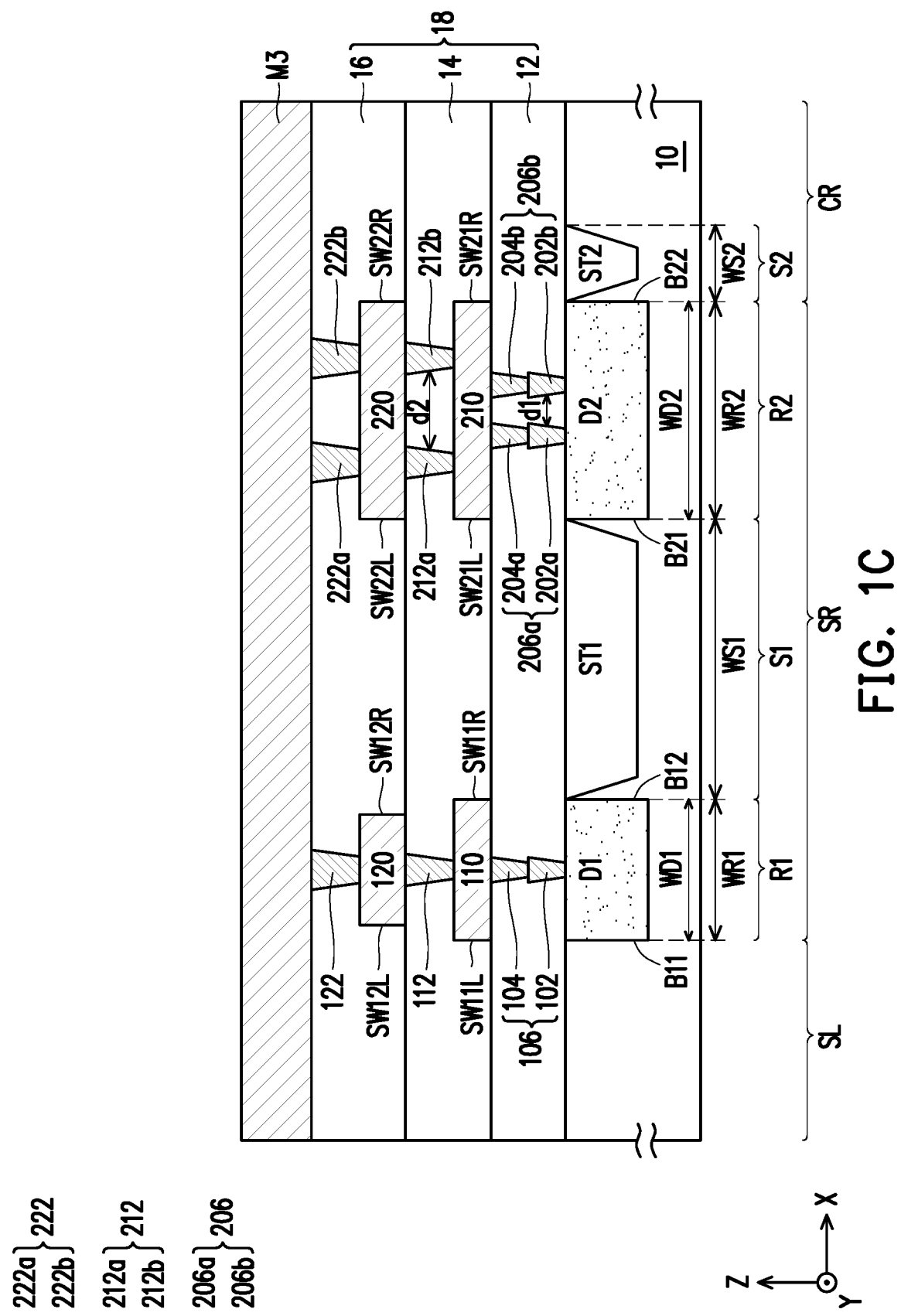
Figure 1D:
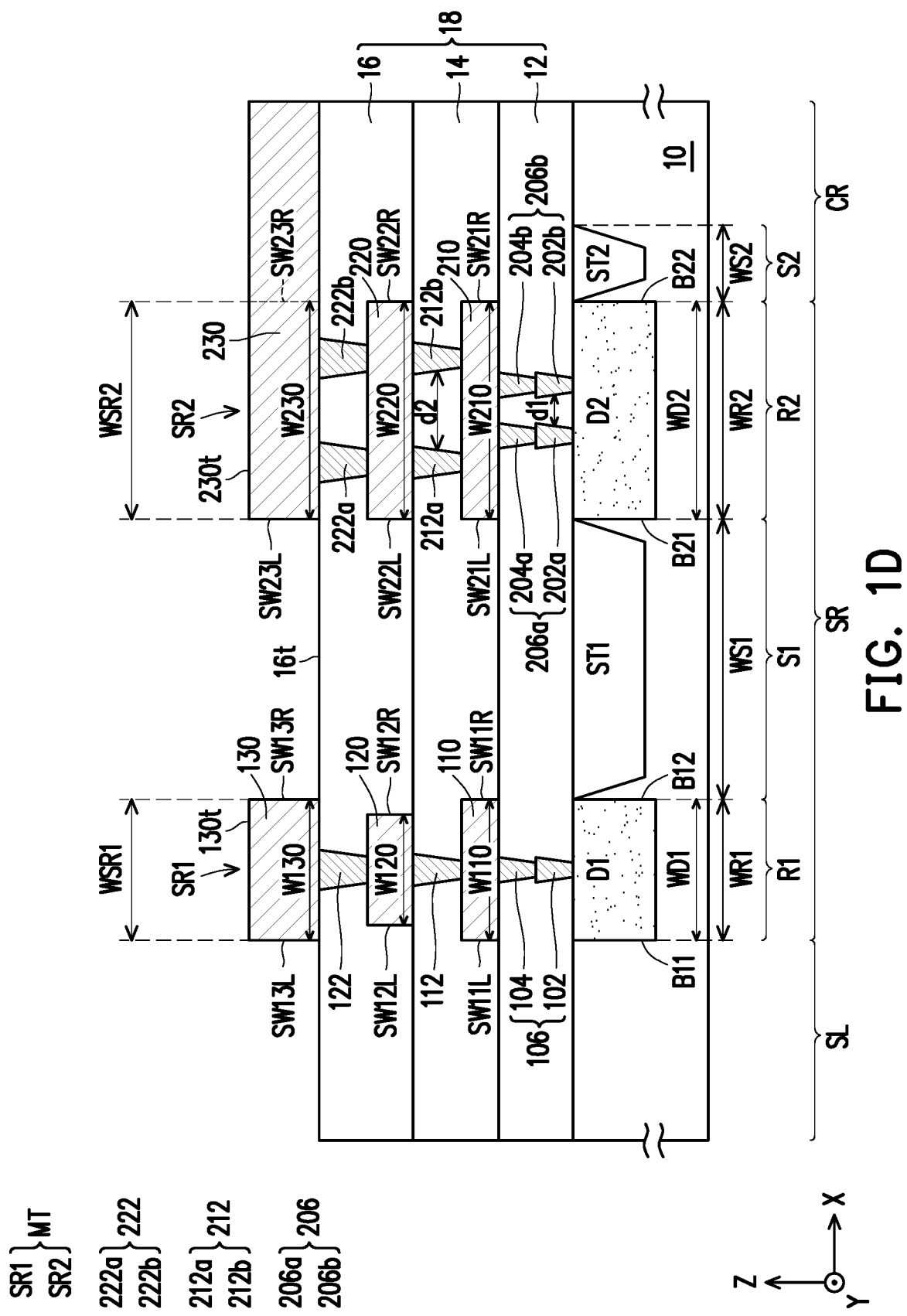

Referring to FIG. 1D, a dielectric structure 18 and a metallized structure MT are formed on the substrate 10. The dielectric structure 18 is located on the chip region CR, the seal ring region SR and the scribe line SL of the substrate 10.

The dielectric structure 18 includes an inter-layer dielectric (ILD) layer 12 and inter-metal dielectric (IMD) layers 14 and 16. In this embodiment, the inter-metal dielectric layer 16 is a top inter-metal dielectric layer, the inter-metal dielectric layer 14 is located between the top inter-metal dielectric layer 16 and the inter-layer dielectric layer 12 and is in physically contact with the top inter-metal dielectric layer 16 and the inter-layer dielectric layer 12, and the inter-layer dielectric layer 12 is located between the inter-metal dielectric layer 140a nd the substrate 10. However, in other embodiments, more than one inter-metal dielectric layer may be inserted between the top inter-metal dielectric layer 16 and the inter-metal dielectric layer 14. The inter-layer dielectric layer 12 and the inter-metal dielectric layers 14 and 16 may be single-layered or multi-layered respectively. The inter-layer dielectric layer 12 and the inter-metal dielectric layer may have same or different materials. The materials of the inter-layer dielectric layer 12 and the inter-metal dielectric layers include silicon oxide, silicon nitride, silicon oxynitride and a low-dielectric constant material. A dielectric constant (a value of k) of the low-dielectric constant material may be lower than 3.0, or even lower than approximately 2.5. Therefore, the low-dielectric constant material may also be referred to as an extremely low-dielectric constant (ELK) material. The inter-layer dielectric layer 12 and the inter-metal dielectric layers 14 and 16 may be planar layers planarized through a chemical mechanical polishing method or an etching back method.

The metallized structure MT is formed in the dielectric structure 18, and a portion of the metallized structure MT is formed on the dielectric structure 18. The metallized structure MT includes a metal interconnection (not shown), a first seal ring SR1 (or referred to as an outer ring) and a second seal ring SR2 (or referred to as an inner ring). The metal interconnection is located in the chip region CR. The first seal ring SR1 and the second seal ring SR2 are respectively located in the first region R1 and the second region R2 in the seal ring region SR. The first seal ring SR1 and the second seal ring SR2 are electrically connected to the first doped region D1 and the second doped region D2 respectively. In addition, static electricity generated in a dicing process is not excessively concentrated on the first seal ring SR1 and the second seal ring SR2 after grounding, thereby avoiding chip damage caused by the electrostatic discharge (ESD) phenomenon.

The metal interconnection, the first seal ring SR1 and the second seal ring SR2 of the metallized structure MT may each include a plurality of conductive layers (conductive lines) 110, 120, 130, 210, 220 and 230 and a plurality of conductive plugs 102, 104, 112, 122, 202a, 202b, 204a, 204b, 212a, 212b, 222a and 222b. The materials of the conductive layers and the conductive plugs may include metal, metal alloys and metal nitrides, for example, conductive materials such as tungsten, aluminum, copper, tantalum, titanium, tantalum nitride, titanium nitride and the like.

In FIG. 1A to 1F, a first conductive layer 110 and a conductive layer 120 or a first conductive layer 210 and a conductive layer 220 are vertically adjacent to each other. However, the present invention is not limited thereto. In other embodiments, more than one conductive layer and one or more conductive plugs may be inserted between the first conductive layer 110 and the conductive layer 120 or between the first conductive layer 210 and the conductive layer 220.

Figure 2:
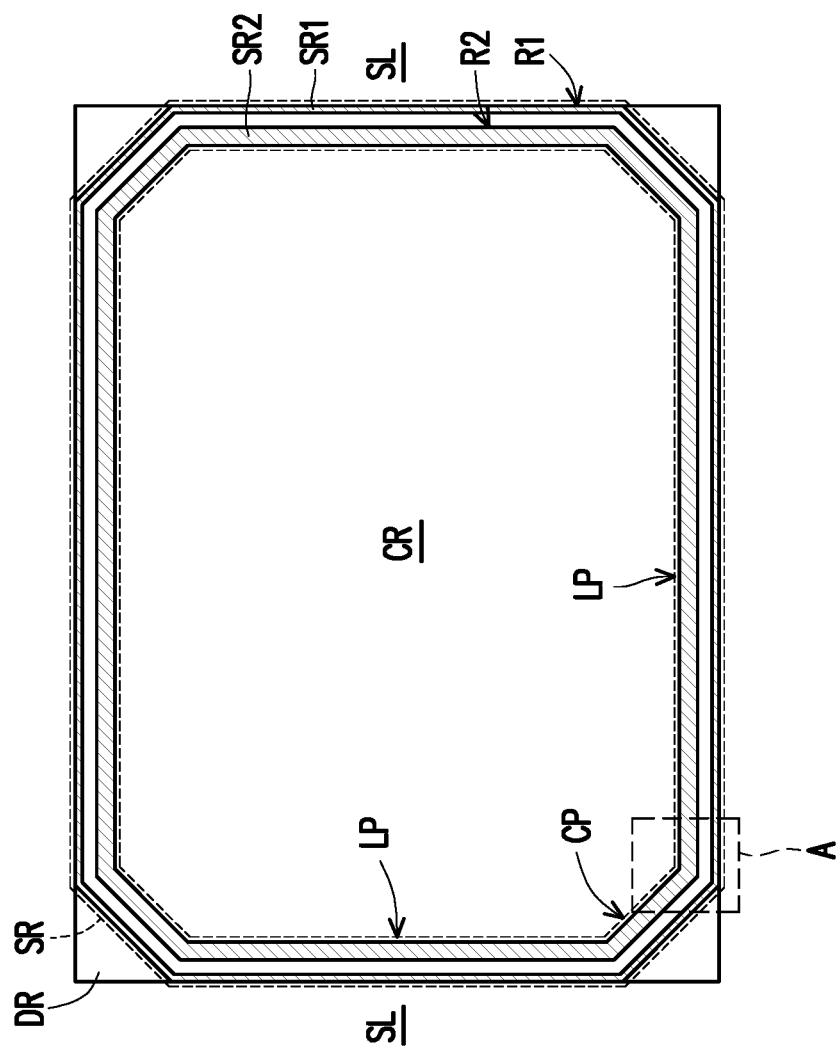
FIG. 2 is a top view of a chip.

The conductive layers 110, 120, 210, and 220 are arranged in the dielectric layers 12 and 14, and the conductive layers 130 and 230 are arranged on the dielectric layer 16 and are substantially parallel to a surface of the substrate 10 (for example, a plane XY). The plurality of the conductive plugs 102, 104, 112, 122, 202a, 202b, 204a, 204b, 212a, 212b, 222a and 222b is arranged in the dielectric layers 12, 14 and 16, and is longitudinally (for example, in a direction Z) connected to the substrate 10 and the first conductive layers 110 and 210, or connected to the two vertically adjacent conductive layers in the conductive layers 110, 120, 130, 210, 220 and 230. Each of the conductive layers 110, 120 and 130 and each of the conductive plugs 102, 104, 112 and 122 of the first seal ring SR1 and the second seal ring SR2 are arranged in a ring to surround an edge of the chip region CR. Similarly, each of the conductive layers 210, 220 and 230 of the second seal ring SR2 and each of the conductive plugs 202a, 202b, 204a, 204b, 212a, 212b, 222a and 222b are arranged in a ring to surround the edge of the chip region CR, as shown in FIG. 2.

Referring to FIG. 1D, the first seal ring SR1 is electrically insulated from elements in the chip region CR and the metal interconnection. In addition, the first seal ring SR1 is physically and electrically isolated from the second seal ring SR2 through the dielectric structure 18 and the first isolation structure ST1. The second seal ring SR2 may be electrically connected to or electrically insulated from the elements in the chip region CR and the metal interconnection. In other words, there is no routing for the first seal ring SR1, and routing is allowed for the second seal ring SR2.

Quantities of the plurality of conductive layers of the metal interconnection, the first seal ring SR1 and the second seal ring SR2 may be the same or different. For example, the metal interconnection, the first seal ring SR1 and the second seal ring SR2 each have N conductive layers, where N is an integer from 3 to 8. In other words, $N^{th}$ conductive layers of the first seal ring SR1 and the second seal ring SR2 are respectively top conductive layers 130 and 230 arranged on the top inter-metal dielectric layer 16. $(N-1)^{th}$ conductive layers of the first seal ring SR1 and the second seal ring SR2 are respectively the conductive layers 120 and 220 arranged in the top inter-metal dielectric layer 16. The $(N-2)^{th}$ conductive layer mentioned in the following content is not shown in FIG. 1A to FIG. 1F. If N is greater than or equal to 4, the $(N-2)^{th}$ conductive layer may refer to a conductive layer arranged between the conductive layer 120 and the first conductive layer 110. If N is equal to 3, the $(N-2)^{th}$ conductive layer may refer to the first conductive layer 110.

The width WSR1 of the first seal ring SR1 is less than the width WSR2 of the second seal ring SR2. The width WSR1 of the first seal ring SR1 herein may refer to an average width of the $(N-2)^{th}$ conductive layer to the first conductive layer 110, and the width WSR2 of the second seal ring SR2 herein may refer to an average width of the $(N-2)^{th}$ conductive layer to the first conductive layer 210. In this embodiment, the widths W110, W120 and W130 of the conductive layers 110, 120 and 130 of the first seal ring SR1 are respectively less than the widths W210, W220 and W230 of the conductive layers 210, 220 and 230 of the second seal ring SR2 at a same level. For example, the width W110 of the $(N-2)^{th}$ conductive layer to the first conductive layer 110 of the first seal ring SR1 is ½ to ⅔ of the width W210 of the $(N-2)^{th}$ conductive layer to the first conductive layer 210 of the second seal ring SR2.

In the first seal ring SR1, the width W130 of the top conductive layer (the $N^{th}$ conductive layer) 130 is greater than or equal to the widths W110 and W120 of all conductive layers (the first conductive layer to the $(N-2)^{th}$ conductive layer) 110 and 120 of the first seal ring SR1. The width W120 of the $(N-1)^{th}$ conductive layer 120 below the top conductive layer 110 is less than or equal to the width W130 of the N$^{th}$ conductive layer 130, and is less than or equal to the width W110 of the (N−2)$^{th}$ conductive layer or the first conductive layer 110. The (N−2)$^{th}$ conductive layer to the first conductive layer 110 may have a same width. For example, the width W120 of the (N−1)$^{th}$ conductive layer 120 is 50% to 70% of the width W130 of the N$^{th}$ conductive layer 130. The width W120 of the (N−1)$^{th}$ conductive layer 120 is 70% to 80% of the width W110 of the first conductive layer 110. The top conductive layer (the N$^{th}$ conductive layer) 130 is arranged on the top inter-metal dielectric layer 16 in the first region R1. A first sidewall SW13L the top conductive layer (the N$^{th}$ conductive layer) 130 that is close to the scribe line SL may be substantially aligned with a first boundary B11 of the first region R1. A sidewall SW13R of the N$^{th}$ conductive layer 130 that is close to the second region R2 may be aligned with a second boundary B12 of the first region R1. Alternatively, a sidewall SW13R of the top conductive layer (the N$^{th}$ conductive layer) 130 that is close to the second region R2 may extend beyond the second boundary B12 of the first region R1 in a direction of the second region R2, to cover the top inter-metal dielectric layer 16 that is located above a portion of the first isolation structure ST1. The (N−1)$^{th}$ conductive layer 120 to the first conductive layer 110 are arranged in the top inter-metal dielectric layer 16 and the inter-metal dielectric layer 14 in the first region R1. The width W120 of the (N−1)$^{th}$ conductive layer 120 is less than the width of the first region R1. In other words, the top surface of the (N−1)$^{th}$ conductive layer 120 is completely covered by the top conductive layer 130, and the sidewalls SW12L and SW12R of the (N−1)$^{th}$ conductive layer 120 is covered by the top inter-metal dielectric layer 16 located in the first region R1. The width W110 of the (N−2)$^{th}$ conductive layer to the first conductive layer 110 is substantially equal to the width WR1 of the first region R1. The two sidewalls SW11L and SW11R of the (N−2)$^{th}$ conductive layer to the first conductive layer 110 may respectively be substantially aligned with the first boundary B11 and the second boundary B12 of the first region R1.

In the second seal ring SR2, the N$^{th}$ conductive layer 230 to the first conductive layer 130 at a same location in the second region R2 may have a same width. The top conductive layer (the N$^{th}$ conductive layer) 230 is arranged on the top inter-metal dielectric layer 16 in the second region R2. A first sidewall SW23L of the top conductive layer (the N$^{th}$ conductive layer) 230 that is close to the first isolation structure ST1 may be substantially aligned with a first boundary B21 of the second region R2. A sidewall SW23R of the top conductive layer (the N$^{th}$ conductive layer) 230 that is close to the second isolation structure ST2 may be substantially aligned with second boundary B22 of the second region R2. In some cases, the top conductive layer (the N$^{th}$ conductive layer) 230 may be used to for routing. The sidewall SW23R of the top conductive layer 230 may extend beyond the second boundary B22 of the second region R2 in a direction of the chip region CR, to cover the dielectric layer 16 that is located above a portion of the second isolation structure ST2, or may even extend to the chip region CR. The (N−1)$^{th}$ conductive layer 220 to the first conductive layer 210 are arranged in the top inter-metal dielectric layer 16 and the inter-metal dielectric layer 14 in the second region R2. The width W210 of the (N−1)$^{th}$ conductive layer 220 to the first conductive layer 210 is substantially equal to the width WR2 of the second region R2. The sidewalls SW22L, SW22R, SW21L and SW21R of the (N−1)$^{th}$ conductive layer 220 to the first conductive layer 110 may be substantially aligned with the first boundary B21 and the second boundary B22 of the second region R2.

Refer to FIG. 1D. The first seal ring SR1 includes conductive plugs 102, 104, 112 and 122, and the second seal ring SR2 includes conductive plugs 202a, 202b, 204a, 204b, 212a, 212b, 222a and 222b. The conductive plugs 102, 104, 202a, 202b, 204a, 204b are contacts located in the inter-layer dielectric layer 12. The contacts 102 and 104 stack each other to form a first contact stacked structure 106, to electrically connect to the first doped region D1 in the substrate 10 and the first conductive layer 110 of the first seal ring SR1. The contacts 202a and 204a stack each other to form a second contact stacked structure 206a, and the contacts 202b and 204b stack each other to form a second contact stacked structure 206b, to be in physically connect with the second doped region D2 in the substrate 10 and the first conductive layer 210 of the second seal ring SR2.

The conductive plugs 112, 122, 212a, 212b, 222a and 222b are also referred to as first vias located in the inter-metal dielectric layers 14 and 16, and may be electrically connected to the two vertically adjacent conductive layers in the conductive layers 110, 120 and 130 of the first seal ring SR1. The conductive plugs 212a, 212b, 222a and 222b are also referred to as second vias located in the inter-metal dielectric layers 14 and 16, and may be electrically connected to the two vertically adjacent conductive layers in the conductive layers 210, 220 and 230 of the second seal ring SR2.

A quantity of conductive plugs in the metal interconnection, the first seal ring SR1 and the second seal ring SR2 may be designed according to actual requirements. The conductive plugs of the first seal ring SR1 may release stress during subsequent dicing. The second seal ring SR2 may be grounded, and a large quantity of conductive plugs may provide better conduction efficiency. Therefore, in an embodiment, a quantity of the conductive plugs of the first seal ring SR1 is less than a quantity of the conductive plugs of the second seal ring SR2 at a same height. In other words, between the substrate 10 and the first conductive layer 110, a quantity (for example, 1) of first contact stacked structures 106 of the first seal ring SR1 in the first region R1 is less than a quantity (for example, 2 or more) of second contact stacked structures 206 of the second seal ring SR2 in the second region R2. Between the first conductive layer 110 and the N$^{th}$ conductive layer 130, a quantity (for example, 1) of first vias 112 or 122 of the first seal ring SR1 in the first region R1 is less than a quantity (for example, 2 or more) of second vias 212 or 222 of the second seal ring SR2 in the second region R2 at a same level.

In the first seal ring SR1 and the second seal ring SR2, the conductive plugs 102, 104, 112, 122, 202, 204, 206, 212 and 222 between the substrate 10 and the top conductive layers 130 and 230 may have different widths. In an embodiment, the widths of the conductive plugs 102, 104, 112, 122, 202, 204, 206, 212 and 222 of the first seal ring SR1 and the second seal ring SR2 increase gradually from the substrate 10 in a direction of the top conductive layers 130 and 230 (that is, from bottom to top). That is, the widths of the conductive plugs 102, 202a and 202b are the smallest, and the widths of the conductive plugs 212, 222a and 222b are the largest. The conductive plugs (for example, 112) of the first seal ring SR1 and the conductive plugs (for example, 212) of the second seal ring SR2 at a same level may have a same width, or have different widths.

In the first seal ring SR1, the conductive plugs 102, 104, 112 and 122 between the substrate 10 and the top conductive layer 130 may be substantially aligned with a central line of the first region R1. Therefore, the conductive plugs are aligned or partially overlap with each other. In the second seal ring SR2, a distance d1 between two plug stacked structures 206a and 206b that are located between the substrate 10 and the first conductive layer 210 is less than a distance d2 between two second vias 212a and 212b that are located between the first conductive layer 210 and the second conductive layer 220, which makes the second vias staggered from each other without overlapping, or with overlapping of very few portions. The distance d1 herein refers to a distance between a sidewall at a half height of the conductive plug 202a and a sidewall at a half height of the conductive plug 202b. The distance d2 herein refers to a distance between a sidewall at a half height of the second via 212a and a sidewall at a half height of the second via 212b. The two second vias 212a and 212b that are located between the conductive layer 210 and the conductive layer 220 may partially overlap with the two vias 222a and 222b that are located between the conductive layer 220 and the conductive layer 230 respectively.

Figure 3:
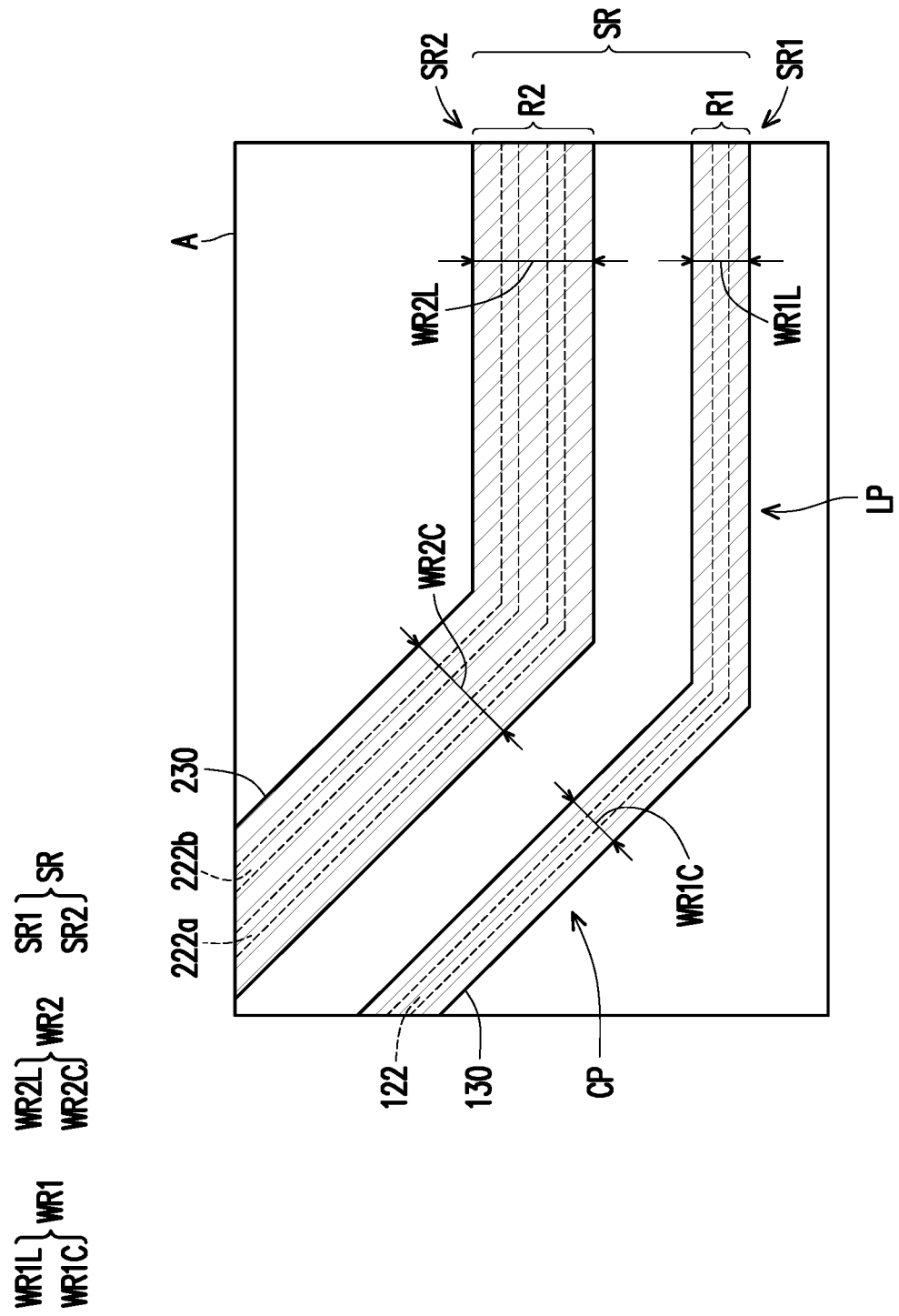
FIG. 3 is a locally enlarged view of a region A in FIG. 2.

Refer to FIG. 1D, FIG. 2 and FIG. 3. According to actual requirements, the seal ring regions may each have a single width or a plurality of widths. The seal ring region SR surrounds the edge of the chip region CR, and includes a straight line segment LP and a corner segment CP. The straight line segment LP is substantially parallel to an edge of the chip. The corner segment CP connects straight line segments LP that are in two different directions. The straight line segment LP and the corner segment CP in the seal ring region SR may have a same width, or have different widths.

The first region R1 or the second region R2 of the seal ring region SR may have a single width or a plurality of widths. For example, in the first region R1, the width WR1C of the corner segment CP is greater than the width WR1L of the straight line segment LP. In the second region R2, the width WR2C of the corner segment CP is greater than the width WR2L of the straight line segment LP. For example, in the first region R1, the width WR1C of the corner segment CP is 1.2 to 1.6 times the width WR1L of the straight line segment LP. In the second region R2, the width WR2C of the corner segment CP is 1.2 to 1.6 times the width WR2L of the straight line segment LP.

In the first seal ring SR1, conductive layers at a same layer may have a single width or a plurality of widths. Similarly, in the second seal ring SR2, conductive layers at a same layer may have a single width or a plurality of widths. For example, in the same conductive layer 130 or 230 that surrounds the chip region CR, the width of the corner segment CP may be greater than the width of the straight line segment LP.

In the first seal ring SR1, a same conductive plug may have a single width or a plurality of widths. Similarly, in the second seal ring SR2, a same conductive plug may have a single width or a plurality of widths. For example, in the conductive plug 122, 222a or 222b that surrounds the chip region CR at a same level, the width of the corner segment CP may be greater than the width of the straight line segment LP.

Refer to FIG. 1D and FIG. 2. A region between the corner segment CP and four corners of the chip is a virtual region DR. In the virtual region DR and a first isolation region S1, there may be a plurality of dielectric layers 12, 14 and 16 and a semiconductive layer (polysilicon) located in the dielectric layer 12. The first isolation region S1 is mainly a stress release boundary; therefore, the first isolation region S1 may have no conductive layers. The virtual region DR has no conductive layers or only has a few conductive layers, to avoid contamination caused by exposure of lower metal layers when the TV is opened subsequently. Therefore, the first isolation region S1 and the virtual region DR have no conductive layers and conductive plugs that correspond to the metallized structure MT. Alternatively, the first isolation region Si and the virtual region DR only have a few conductive layers and conductive plugs that correspond to the metallized structure MT, but the dielectric structure 18 has no top conductive layers. In other words, a quantity of conductive layers on the first isolation structure ST1 is equal to or less than N, but other top conductive layers do not exist at a same level of the top conductive layers 130 and 230 of the first seal ring SR1 and the second seal ring SR2. In this way, the top surface of the first isolation region S1 (that is, a top surface 16t of the dielectric layer 16) is lower than the top surfaces of the first region R1 and the second region R2 (that is, a top surface 130t of the top conductive layer 130 and a top surface 30t of the top conductive layer 230).

The metal interconnection, the first seal ring SR1 and the second seal ring SR2 may be formed at the same time or at different time. The conductive layer and the conductive plug may each be formed through deposition, lithography, etching and the like. In other embodiments, the conductive layer and the conductive plug may be formed through a dual damascene process. Processes of the metal interconnection, the first seal ring SR1 and the second seal ring SR2 are described below with reference to FIG. 1A to FIG. 1D.

Refer to FIG. 1A. In the chip region CR, a plurality of electric devices (not shown) may be formed in the substrate 10 and/or on the substrate 10. The electric device may include an active device and a passive device. For example, the active device is a transistor or a diode. For example, the passive device is a resistor, a capacitor, or an inductor. In addition, in the scribe line SL, a plurality of test keys or alignment marks that correspond to the electric devices may be formed in the substrate 10 and/or on the substrate 10. Subsequently, a dielectric material layer is formed on the substrate 10, and is planarized through a chemical mechanical polishing process to form a dielectric layer 12a.

Then, a lithography and etching process is performed. A contact opening is formed in the dielectric layer 12a. For example, the contact openings each are a ring trench. Subsequently, conductor material layers are filled on the dielectric layer 12a and filled in the contact opening respectively. The conductor material layers may be formed through a chemical vapor deposition method or a physical vapor deposition method. Then, a planarization process, for example, a chemical mechanical polishing process is performed on the conductor material layers, to remove the conductor material layers from the dielectric layer 12a and form the conductive plugs 102, 202a and 202b respectively in the contact openings.

Then, a dielectric layer 12b and the conductive plugs 104, 204a and 204b are formed through a similar process. Then, a conductor material layer M1 is formed on the substrate 10. The conductor material layer M1 may be formed through a chemical vapor deposition method or a physical vapor deposition method.

Subsequently, refer to FIG. 1B. The lithography and etching process is performed on the conductor material layer M1 to form the conductive layers 110 and 210. Then, the dielectric layer 14 is formed on the substrate 10. Then, the conductive plugs 112, 212a and 212b are formed in the dielectric layer 14 before a conductor material layer M2 is formed on the substrate 10.

Subsequently, refer to FIG. 1C. The lithography and etching process is performed on the conductor material layer M2 to form the conductive layers 120 and 220. Then, the dielectric layer 16 is formed on the substrate 10. The conductive plugs 122, 222*a* and 222*b* are formed in the dielectric layer 16. A conductor material layer M3 is formed on the substrate 10.

Subsequently, refer to FIG. 1D. The lithography and etching process is performed on the conductor material layer M3 to form the conductive layers 130 and 230.

Figure 1E:
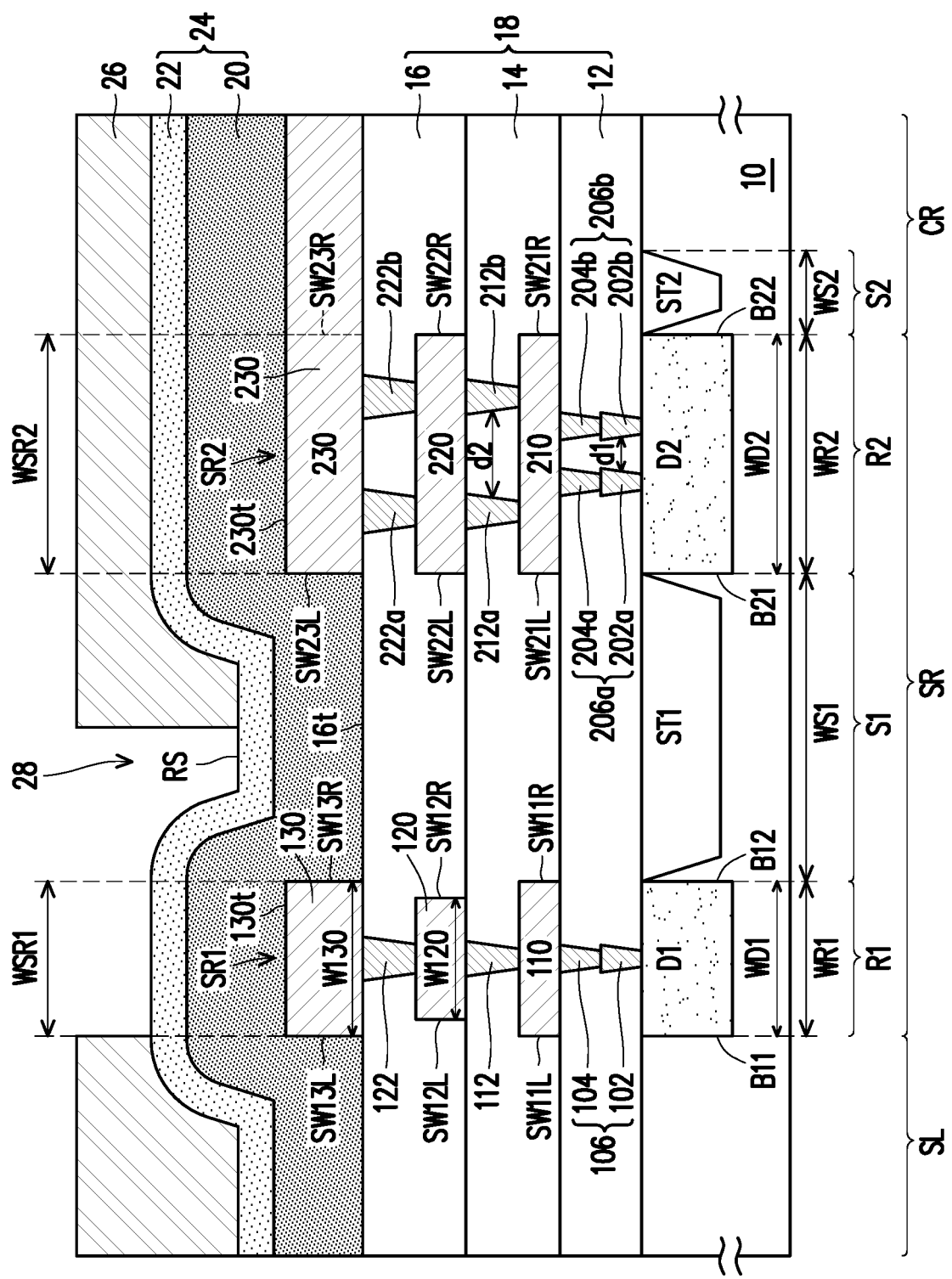

Refer to FIG. 1E. A protective layer 24 is formed on the substrate 10. The protective layer 24 may be a single-layered or stacked structure. In an embodiment, the protective layer 24 includes a first protective layer 20 and a second protective layer 22. The first protective layer 20 covers the top surface of the dielectric structure 18 and the top surfaces and the sidewalls of the top conductive layers 130 and 230. The second protective layer 22 covers the first protective layer 20. The first protective layer 20 includes dielectric materials such as silicon dioxide and spin-on glass (SOG). The second protective layer 22 includes insulation materials with waterproof and gaseous properties such as polymeric and silicon nitride. For example, the thickness of the first protective layer 20 is 0.8 μm to 1.5 μm, and the thickness of the second protective layer is 0.3 μm to 0.8 μm.

The top surface 16*t* of the dielectric layer 16 in the first isolation region S1 is lower than the top surface 130*t* of the top conductive layer 130 in the first region R1 and the top surface 230*t* of the top conductive layer 230 in the second region R2. Therefore, the protective layer 24 is formed according to the topography of the substrate 10 and is not planarized, and the protective layer 24 on the first isolation region S1 has a concave surface RS.

Subsequently, refer to FIG. 1E. A mask layer 26 is formed on the protective layer 24. For example, the mask layer 26 is a patterned photoresist layer. The mask layer 26 has an opening 28 exposing the protective layer 24 that is located above the first seal ring SR1 and a portion of the concave surface RS of the protective layer 24 that is located above the first isolation region S1.

Figure 1F:
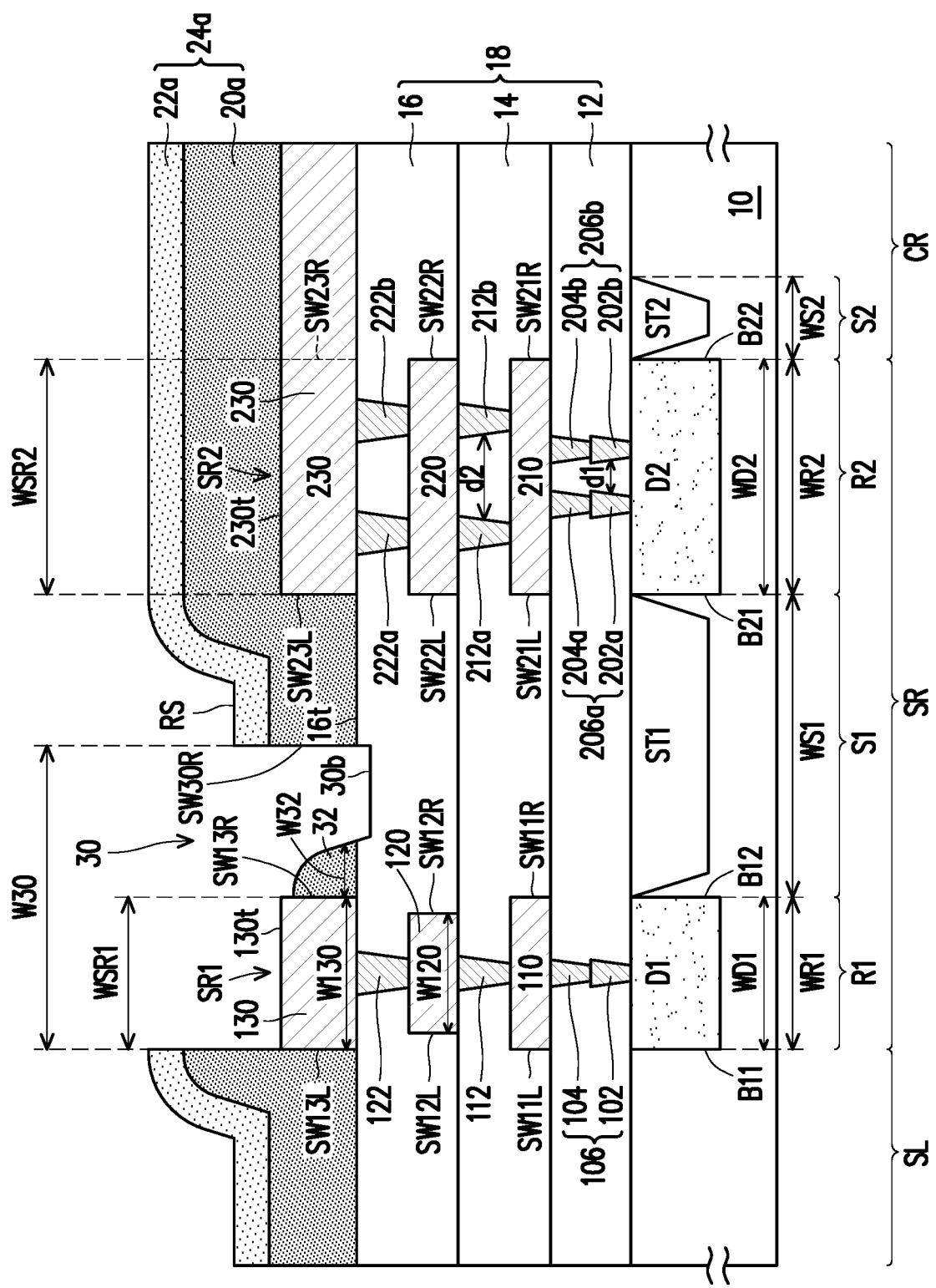

Subsequently, refer to FIG. 1E and FIG. 1F. For example, an anisotropic etching process is performed by using the mask layer 26 as a mask to form an opening (also referred to as an opening of a TV) 30 in the protective layer 24, and to form a spacer 32 on a sidewall SW13R of the top conductive layer 130 of the first seal ring SR1 and a protective layer 24*a* is left. Then, the mask layer 26 is removed. In other embodiments, the protective layer 24 includes photosensitive materials, which enables an exposure development process to be performed on the protective layer 24 to form the opening 30.

The width W30 of the opening 30 of the protective layer 24*a* is greater than the width WSR1 of the first seal ring SR1, and is greater than the width W130 of the top conductive layer 130. For example, the width W30 of the opening 30 is 2 μm. The opening 30 exposes the top surface 130*t* of the top conductive layers 130 of the first seal ring SR1 and the spacer 32. A bottom surface 30*b* of the opening 30 is located above the first isolation structure ST1. In this way, the bottom surface 30*b* of the opening 30 is the lowest height among surfaces of the first region R1, the second region R2 and the first isolation region S1. In an embodiment, the bottom surface 30*b* of the opening 30 is close to the first seal ring SR1, and is away from the second seal ring SR2. The bottom surface 30*b* of the opening 30 exposes the top dielectric layer 16 of the dielectric structure 18 above the first isolation structure ST1. The height of the bottom surface 30*b* of the opening 30 may be equal to or less than the height of a bottom surface 130*b* of the top conductive layer 130 of the first seal ring SR1. For example, the bottom surface 30*b* of the opening 30 is approximately 10 nm lower than the bottom surface 130*b* of the top conductive layer 130 of the first seal ring SR1.

On a side (in a direction of the second seal ring SR2) of the bottom surface 30*b* of the opening 30, the top surface 16*t* of the dielectric layer 16 on the first isolation structure ST1, the sidewall SW23L of the top conductive layer 230 of the second seal ring SR2, and the top surface 230*t* are covered by the remained protective layer 24*a*, and the remained protective layer 24*a* (the first protective layer 20*a* and the second protective layer 22*a*) in a rising ladder shape. On another side (in a direction of the first seal ring SR1) of the bottom surface 30*b* of the opening 30, the spacer 32 covers the sidewall SW13R of the top conductive layer 130 of the first seal ring SR1. The remained protective layer 24*a* may make the entire top surface 130*t* of the top conductive layer 130 of the first seal ring SR1 be exposed, or make only a portion of the top surface 130*t* be exposed. The remained protective layer 24*a* covers the sidewall SW13L of the top conductive layer 130 of the first seal ring SR1 and the dielectric structure 18 in the scribe line SL.

The spacer 32 may completely cover the sidewall SW13R of the top conductive layer 130 of the first seal ring SR1. Alternatively, the spacer 32 may not completely cover the sidewall SW13R of the top conductive layer 130 of the first seal ring SR1. In other words, the height of a top surface of the spacer 32 may be equal to or less than the height of the top surface 130*t* of the top conductive layer 130 of the first seal ring SR1 without a staged difference or forming a ladder shape. For example, the width W32 of a bottom surface of the spacer 32 is 0.2 μm to 0.4 μm.

The width W120 of the conductive layer 120 is less than the width of the top conductive layer 130. Therefore, in an etching process of forming the opening 30, damage of the conductive layer 120 caused by overetching may be avoided. In addition, the spacer 32 may also provide a lateral distance, which keeps the bottom surface 30*b* of the opening 30 away from the conductive layer 120, thereby avoiding damage of the conductive layer 120 caused by overetching in the etching process of forming the opening 30.

The top conductive layer 130 of the first seal ring SR1 that is exposed by the opening 30 may be used as a cut for a subsequent dicing process. The width W30 of the opening 30 is greater than the width W130 of the top conductive layer 130 of the first seal ring SR1, and the protective layer 24*a* beside the sidewall SW30R of the opening 30 is in a ladder shape. Therefore, this helps perform relevant processes such as testing or packaging. For example, in the subsequent packaging process, an UBM layer may be easily filled in the opening 30 of the present invention with better step coverage.

In the embodiments of the present invention, the first seal ring (the outer ring) is not used for routing, and the second seal ring (the inner ring) may be used for routing. Therefore, the width of the first seal ring may be reduced, and a spacing between the first seal ring and the second seal ring may be reduced, thereby reducing a chip area occupied by seal rings. In addition, the first seal ring is small in size, and there may be only one conductive plug between the two vertically adjacent conductive layers. The second seal ring (the inner ring) is large in size, and there may be two or more conductive plugs between the two vertically adjacent conductive layers. Further, the metallized structure is not formed in the virtual region of the four corner segments of the chip, which may reduce cracks caused in a subsequent chip dicing process and reduce a risk of underlying metal exposure in the process. The width of the top via (TV) is greater than the width of the top conductive layer of the outer ring, which helps improve the step coverage of a film formed subsequently in the opening.

Although the present invention has been disclosed above through the embodiments, the embodiments are not intended to limit the present invention. Any person skilled in the art may make some variations or modifications without departing from the spirit and scope of the present invention. Therefore, the protection scope of the present invention shall be subject to the appended claims.

What is claimed is:

1. A method of fabricating a semiconductor device, comprising:
   forming, on a substrate, a first seal ring and a second seal ring that are separated from each other;
   forming, on the substrate, a protective layer covering the first seal ring and the second seal ring, wherein the protective layer between the first seal ring and the second seal ring comprises a concave surface; and
   removing the protective layer at the concave surface and a portion of the protective layer on the first seal ring to form a spacer on a sidewall of the first seal ring and form an opening in the protective layer, wherein the width of the opening is greater than the width of the first seal ring, and the opening exposes a top surface of the first seal ring and the spacer.

2. The method of fabricating a semiconductor device according to claim 1, wherein the first seal ring and the second seal ring comprise a same quantity of conductive layers.

3. The method of fabricating a semiconductor device according to claim 2, wherein a width of a top conductive layer of the first seal ring is less than a width of a top conductive layer of the second seal ring.

4. The method of fabricating a semiconductor device according to claim 2, wherein a width of a conductive layer below the top conductive layer of the first seal ring is less than or equal to widths of two conductive layers of the first seal ring adjacent thereto in a longitudinal direction.

5. The method of fabricating a semiconductor device according to claim 2, wherein the spacer is located on a portion of a sidewall of a top conductive layer of the first seal ring.

6. The method of fabricating a semiconductor device according to claim 2, wherein the height of a bottom surface of the opening is equal to or less than the height of a bottom surface of a top conductive layer of the first seal ring.

7. The method of fabricating a semiconductor device according to claim 6, wherein the bottom surface of the opening exposes a dielectric layer formed on the substrate.

8. The method of fabricating a semiconductor device according to claim 2, wherein a quantity of conductive layers between the concave surface and a surface of the substrate is less than the quantity of the conductive layers of the first seal ring.

9. The method of fabricating a semiconductor device according to claim 1, wherein the concave surface is located above an isolation structure in the substrate.

10. The method of fabricating a semiconductor device according to claim 1, wherein the first seal ring comprises a plurality of first vias, the second seal ring comprises a plurality of second vias, and a quantity of the first vias is less than a quantity of the second vias.

11. A semiconductor device, comprising:
    a first seal ring and a second seal ring that are separated from each other on a substrate;
    a spacer, arranged on a first sidewall of the first seal ring; and
    a protective layer, arranged on the substrate, and covering a second sidewall of the first seal ring and the second seal ring, wherein the protective layer comprises an opening exposing a top surface of the first seal ring and the spacer, wherein the first seal ring comprises a spacer located on a portion of a sidewall of a top conductive layer of the first seal ring, and the spacer comprises a same material as the protective layer.

12. The semiconductor device according to claim 11, wherein the first seal ring and the second seal ring each comprise a plurality of conductive layers respectively.

13. The semiconductor device according to claim 11, wherein the width of the top conductive layer of the first seal ring is less than a width of a top conductive layer of the second seal ring.

14. The semiconductor device according to claim 11, wherein a width of a conductive layer below the top conductive layer of the first seal ring is less than or equal to widths of two conductive layers of the first seal ring adjacent thereto in a longitudinal direction.

15. The semiconductor device according to claim 11, wherein the height of a bottom surface of the opening is equal to or less than the height of a bottom surface of the top conductive layer of the first seal ring.

16. The semiconductor device according to claim 15, wherein the bottom surface of the opening exposes a dielectric layer located on the substrate.

17. The semiconductor device according to claim 11, wherein a quantity of conductive layers between the opening and the substrate is less than the quantity of the conductive layers of the first seal ring.

18. The semiconductor device according to claim 11, wherein the first seal ring comprises a plurality of first vias, the second seal ring comprises a plurality of second vias, and a quantity of the first vias is less than a quantity of the second vias.

19. The semiconductor device according to claim 11, wherein there is no routing for the first seal ring, and the second seal ring is used for routing.

20. A semiconductor device, comprising:
    a first seal ring and a second seal ring that are separated from each other on a substrate;
    a spacer, arranged on a first sidewall of the first seal ring; and
    a protective layer, arranged on the substrate, and covering a second sidewall of the first seal ring and an entire of the second seal ring, wherein the protective layer comprises an opening exposing a top surface of the first seal ring and the spacer.

* * * * *